(12) United States Patent
Nakashima (10) Patent No.: US 9,648,764 B2
(45) Date of Patent: May 9, 2017

(54) FIXING STRUCTURE OF ELECTRIC APPARATUS TO VEHICLE

(71) Applicant: Toyota Jidosha Kabushiki Kaisha, Toyota-shi Aichi-ken (JP)

(72) Inventor: Masaru Nakashima, Okazaki (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 206 days.

(21) Appl. No.: 14/677,375

(22) Filed: Apr. 2, 2015

(65) Prior Publication Data

US 2015/0305177 A1 Oct. 22, 2015

(30) Foreign Application Priority Data

Apr. 21, 2014 (JP) ................................ 2014-087322

(51) Int. Cl.
*B60K 5/00* (2006.01)
*H05K 5/02* (2006.01)
*B60L 11/00* (2006.01)
*H05K 7/14* (2006.01)

(52) U.S. Cl.
CPC ............ *H05K 5/0204* (2013.01); *B60L 11/00* (2013.01); *H05K 7/1432* (2013.01)

(58) Field of Classification Search
USPC ........ 180/232; 280/784; 296/187.03, 187.08, 296/187.09
See application file for complete search history.

(56) References Cited

U.S. PATENT DOCUMENTS

| 7,144,039 | B2* | 12/2006 | Kawasaki | B60K 1/04 180/232 |
| 7,771,137 | B2* | 8/2010 | Anzai | B62D 21/11 180/232 |
| 8,540,282 | B2* | 9/2013 | Yoda | B60K 1/04 180/232 |
| 8,573,647 | B2* | 11/2013 | Enning | B60K 1/04 180/232 |
| 8,893,843 | B2* | 11/2014 | Hayano | B60L 15/007 180/232 |

(Continued)

FOREIGN PATENT DOCUMENTS

JP 2009-038920 A 2/2009
JP 2009-090818 A 4/2009

(Continued)

*Primary Examiner* — Toan To
(74) *Attorney, Agent, or Firm* — Dinsmore & Shohl LLP (57) ABSTRACT

Provided is a fixing structure of an electric apparatus in an engine compartment provided in a front portion of a vehicle. The fixing structure includes a tray, a removal mechanism, and a protecting plate. The tray is fixed in the engine compartment and configured such that the electric apparatus is placed thereon. The removal mechanism is configured to remove the electric apparatus from the tray when the electric apparatus receives a predetermined impact force or more from a front side of the vehicle. The protecting plate is attached to the electric apparatus, and is configured to abut with a structural object placed at a rear side of the vehicle relative to the electric apparatus when the electric apparatus is removed from the tray due to the impact force so as to move rearward.

3 Claims, 6 Drawing Sheets

(56) References Cited

U.S. PATENT DOCUMENTS

| | | | |
|---|---|---|---|
| 2007/0051549 A1* | 3/2007 | Fukuda | B60K 1/00 180/232 |
| 2013/0270808 A1* | 10/2013 | Young | B62D 21/155 280/784 |
| 2015/0121767 A1 | 5/2015 | Nagamori et al. | |
| 2015/0197144 A1* | 7/2015 | Jarocki | B60K 1/04 180/232 |
| 2015/0251560 A1* | 9/2015 | Ishikawa | B62D 21/15 180/232 |

FOREIGN PATENT DOCUMENTS

| | | |
|---|---|---|
| JP | 2011225115 A | 11/2011 |
| JP | 2013-086680 A | 5/2013 |
| JP | 2013-237413 A | 11/2013 |
| WO | 2013172272 A1 | 11/2013 |

\* cited by examiner

FIG. 6 ated in Japanese Patent Application Publication No. 2013-
FIXING STRUCTURE OF ELECTRIC APPARATUS TO VEHICLE

INCORPORATION BY REFERENCE

The disclosure of Japanese Patent Application No. 2014-087322 filed on Apr. 21, 2014 including the specification, drawings and abstract is incorporated herein by reference in its entirety.

BACKGROUND OF THE INVENTION

1. Field of the Invention

The present invention relates to a fixing structure of an electric apparatus to a vehicle. Particularly, the present invention relates to a fixing structure of an electric apparatus in an engine compartment provided in a front portion of the vehicle. Note that a technique described in the present invention can be applied to an electrically-driven vehicle that does not include an engine. Even in a case of the electrically-driven vehicle that does not include an engine, that space in the front portion of the vehicle in which a drive motor (a drive source) is provided is referred to as an "engine compartment" according to a practice of the field of automobile. Further, in the present specification, in order to simplify the description, an "engine compartment in a front portion of the vehicle" may be just referred to as a "compartment."

2. Description of Related Art

In recent years, a vehicle is equipped with various electrical apparatuses. Cases of such electric apparatuses are not so rigid as compared with cases of an engine and a transmission, so the cases may receive a large damage due to an impact at the time of a collision from a front side. A technique to relax a damage received by an electric apparatus in a compartment at the time of a collision is exemplified in Japanese Patent Application Publication No. 2013-086680 (JP 2013-086680 A), Japanese Patent Application Publication No. 2013-237413 (JP 2013-237413 A), and Japanese Patent Application Publication No. 2009-038920 (JP 2009-038920 A). In those documents, a target electric apparatus to be protected is an inverter configured to supply electric power to a drive motor. Such an inverter includes components (high-voltage components) to which a high voltage of 100 V or more is applied. Accordingly, it is required to prevent such a problem that a case of the inverter is broken at the time of a collision and the components are exposed. In the technique described in JP 2013-086680 A, an inverter is fixed to a tray (a mounting table). The tray is fixed to a side member that is one of frames of a vehicle. The inverter is fixed to the tray by use of a bracket. In order to protect the inverter from an impact at the time of a collision, the bracket includes a removal mechanism configured to remove the inverter from the tray at the time of receiving an impact from a front side of the vehicle. The removal mechanism has a structure to fix the inverter to the tray by passing a bolt through a U-shaped slit provided in the bracket. Upon receipt of the impact, the bracket moves relative to the bolt along the U-shaped slit, so as to be removed from the bolt. Further, the tray extends to a rear side of the inverter, and is curved toward a rear upper side. A brake unit is placed at the rear upper side of the inverter, and a rear end of the tray extends to a front side of the brake unit. When the inverter moves rearward due to an impact of a collision, that rear part of the tray which is curved enters between the brake unit and the inverter, so that the inverter is protected from a collision with the brake unit.

JP 2013-237413 A describes a technique to protect a connector of a power cable provided on a rear face of an inverter. The technique is as follows. In order to protect the connector and the power cable, a protective cover is attached to a top face of the inverter. The protective cover extends to a rear side of the inverter, and is curved downward behind the inverter. An edge of a body panel of the vehicle is placed behind the inverter. When the inverter moves rearward due to an impact of a collision, the protective cover collides with the edge of the body panel, and the protective cover that is curved originally is further curved downward so as to cover the power cable and the connector to protect them.

JP 2009-038920 A describes a technique in which a cover is attached to a connector accommodation portion of an inverter so as to protect a connector from an impact of a collision.

SUMMARY OF THE INVENTION

In view of the conventional techniques, the present invention provides a fixing structure that increases collision safety of an electric apparatus provided in a compartment of a vehicle.

One aspect of the present invention provides a fixing structure of an electric apparatus, constituted by a tray, a removal mechanism, and a protecting plate. The electric apparatus is provided in an engine compartment provided in a front portion of a vehicle. The tray is fixed in the engine compartment. The tray is configured to place the electric apparatus. The removal mechanism is configured to remove the electric apparatus from the tray when the electric apparatus receives a predetermined impact force or more from a front side of the vehicle. See JP 2013-086680 A that describes a specific exemplary configuration of the removal mechanism. A magnitude of an impact that operates the removal mechanism is determined appropriately by simulation or experiment.

The protecting plate is attached to the electric apparatus, and is configured to abut with a structural object placed at a rear side of the vehicle relative to the electric apparatus when the electric apparatus is removed from the tray due to the impact force so as to move rearward.

Further, in the fixing structure, the protecting plate may be attached to the electric apparatus at a position opposed to the structural object in a front-rear direction of the vehicle. According to the fixing structure, the removal mechanism relaxes the impact applied to the electric apparatus. At the same time, the protecting plate protects the electric apparatus as a protection target from a collision with the structural object placed behind the electric apparatus.

The technique described in the present specification can be applied not only to the inverter, but also to various electric apparatuses provided in the compartment. The technique described in the present specification can be applied to a battery, for example.

In-vehicle electric apparatuses such as the inverter and the battery of an electrically-driven vehicle are smaller than an engine and a motor, but are important components. With respect to such electric apparatuses, the protecting plate may have the following shape. That is, the protecting plate may be fixed to a rear face of the electric apparatus and extend downward, and the protecting plate may be curved in a U-shape so as to project toward the structural object when viewed from a crosswise direction of the vehicle. Alternatively, the protecting plate may be fixed to a rear face of the electric apparatus and extend downward, and the protecting plate may be curved in a C-shape so as to project toward the structural object when viewed from a crosswise direction of the vehicle. A bottom end of the protecting plate may be placed at the same height as a bottom end of the electric apparatus or placed at a position lower than the bottom end of the electric apparatus.

Further, in the fixing structure, the removal mechanism may include a bracket and a bolt. The bracket may have a slit, and may be attached to the electric apparatus. The bolt may be configured to fix the bracket to the tray.

The above fixing structure of the electric apparatus has the following advantage. At the time of a collision, the electric apparatus is removed from the tray and moves rearward, so that the U-shaped curved portion or the C-shaped curved portion of the protecting plate collides with the structural object behind the electric apparatus. At this time, the curved portion is deformed due to a force of the collision. Since the protecting plate is fixed to an in-vehicle apparatus above the U-shaped curved portion or the C-shaped curved portion, the protecting plate is deformed at the time of the collision so that its bottom end slips under the case. In reaction to the protecting plate slipping under the case, the rear end of the electric apparatus is lifted, and the protecting plate moves rearward so as to slip over the structural object behind the electric apparatus. Thus, the in-vehicle electric apparatus moves toward an upper side of the structural object behind the in-vehicle electric apparatus, thereby making it possible to prevent a strong collision with the structural object.

According to the technique described in the present specification, it is possible to increase collision safety of an electric apparatus provided in an engine compartment of a front portion of a vehicle.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

This section describes a fixing structure of an inverter of an electrically-driven vehicle as a typical example of a fixing structure described in the present invention. Important devices such as an inverter, an engine (motor), and a transmission are fixed to a frame for supporting a body. Particularly, in many vehicles, two frames extending in a front-rear direction are provided below a compartment (an engine compartment of a front portion of a vehicle), and the inverter and the motor are fixed to the frames. The two frames extending in the front-rear direction are referred to as side members. In a case where some devices are fixed to the side members extending in the front-rear direction, those devices are aligned in the front-rear direction. In a typical example, the engine (motor) is fixed between the two side members, and the inverter is fixed to one of the side members in front of the engine. Particularly, the engine (motor) is large, and further, becomes a source of vibration. In view of this, a vibration isolation bracket referred to as an engine mount is attached to each of the two side members, so that the engine (motor) is fixed to the side members via the engine mounts. Note that, in a case of an electrically-driven vehicle including only a motor without an engine, the "engine mount" indicates a bracket for fixing the motor or a transmission including the motor.

Even in a case where the "engine mount" fixes a drive source (motor) that does not include an engine, it is referred to as the "engine mount" practically. In the present specification, a drive unit including the motor is referred to as a motor unit. The "motor unit" may include only a motor, a motor and an engine, a motor and a transmission, or a motor, an engine, and a transmission.

In order to fix the motor unit firmly, the motor unit is fixed to the engine mount to the engine mount by a rigid and large bolt (engine mount bolt). The inverter is fixed in front of the motor unit. In order to relax an impact of a collision, if the inverter is fixed so as to be removable upon receipt of the impact as described in the technique of JP 2013-086680 A, a rear part of the inverter may collide with the rigid and large bolt at the time when the inverter moves rearward due to the collision, so that a case of the inverter might be damaged.

In view of this, in the fixing structure described in the present invention, a protecting plate is attached to a rear face of the case of the inverter fixed to the side member in the compartment. More specifically, the protecting plate is attached to the rear face of the case at a position opposed to the engine mount bolt, so as to abut with the engine mount bolt when the inverter moves rearward due to an impact of a collision.

The case of the inverter is often made of aluminum. When the rigid bolt collides with the aluminum case, the case is damaged. The protecting plate protects the case from such damage. Note that an iron lower cover may be attached to a bottom face of the aluminum case. Since the iron lower cover is rigid, the protecting plate should be placed so as to be opposed to the aluminum case. It is preferable that a gap be provided between a bottom end of the protecting plate and the case, so as not to interfere with attachment and detachment of the lower cover. Note that the bottom end of the protecting plate may be placed below the lower cover.

Figure 1:
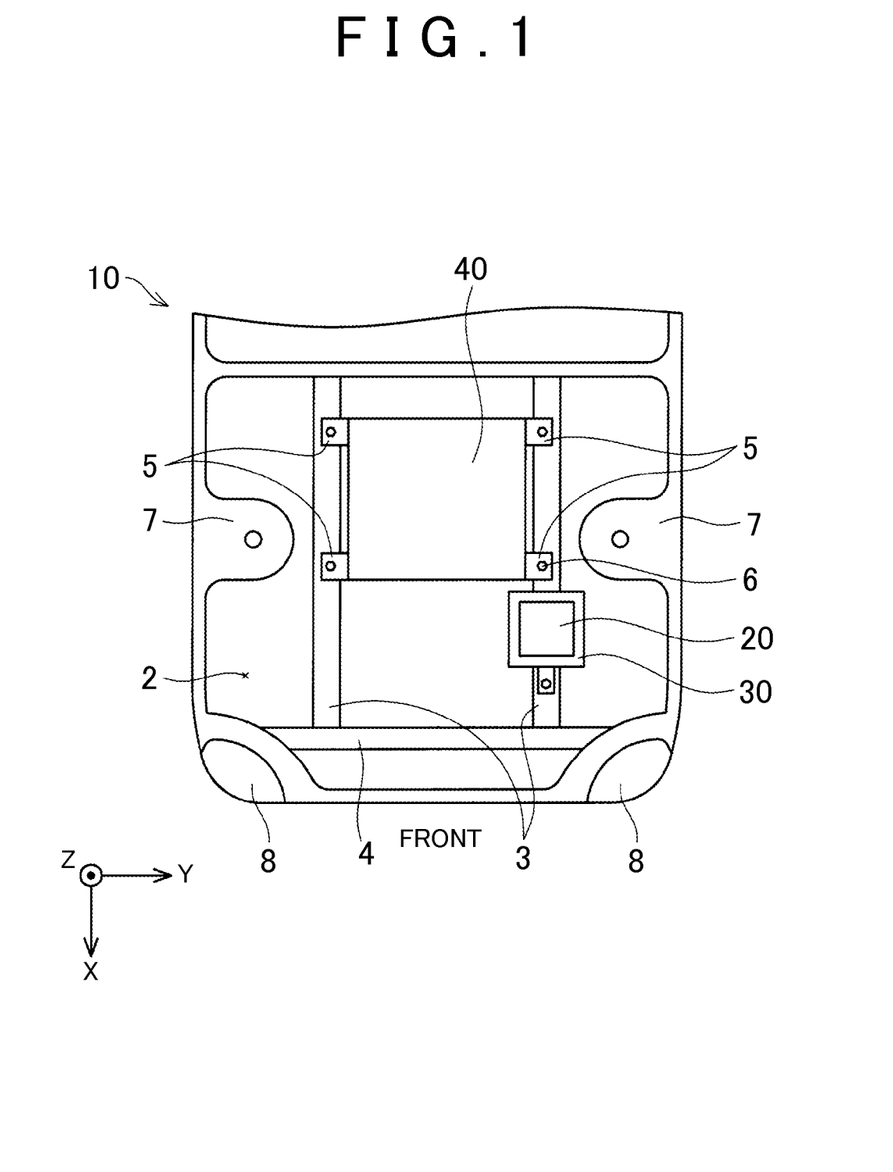
FIG. 1 is a schematic plan view of an engine compartment of an electrically-driven vehicle according to an embodiment of the present invention.

The following describes a fixing structure according to an embodiment with reference to the drawings. The fixing structure to be described in the present embodiment targets an inverter 20 provided in an electrically-driven vehicle 10. The electrically-driven vehicle 10 is an electric vehicle that runs by a motor. FIG. 1 is a schematic plan view illustrating a device layout in a compartment of the electrically-driven vehicle 10. As described above, the "compartment" is a space provided in a front portion of the vehicle, and indicates a space (engine compartment) in which to accommodate a driving device. Note that some devices unnecessary for the description of the present invention are not illustrated in FIG. 1. However, a headlight 8 and a suspension tower 7 are illustrated for easy understanding of an orientation of the compartment. Further, in all the figures, a positive direction along an X-axis corresponds a front side of the vehicle, a Y-axis corresponds to a width direction of the vehicle, and a positive direction along a Z-axis corresponds to a vertically upper side. Further, in the following description, a "front side" indicates a front end side of the vehicle, and a "rear side" indicates a rear end side of the vehicle.

Various devices are placed in the compartment 2, but FIG. 1 only illustrates a motor unit 40, the inverter 20, and members for supporting them. When the compartment 2 is observed from above, two side members 3 extending in a front-rear direction and a cross member 4 extending in a width direction of the vehicle, among frames of the vehicle, pass through the compartment 2. A device having a largest weight is the motor unit 40. The motor unit 40 is placed between the two side members 3. The motor unit 40 is fixed at two places in each of right and left side members via engine mounts 5. A reference sign 6 indicates a bolt for fixing the motor unit 40 to the engine mount 5. The bolt is a particularly large bolt, and, in the following description, the bolt is referred to as an engine mount bolt 6. The engine mount 5 is constituted by a vibration isolating rubber and a bracket (a metal fitting), and serves as a device for relaxing vibration of the motor unit 40. Note that the engine mount 5 is a structural object for supporting the motor unit, but is referred to as an "engine" mount according to a conventional practice.

The inverter 20 converts a direct-current power of a battery (not shown) into an alternating-current power, and supplies it to the motor unit (the motor). The inverter 20 is fixed to the side member 3 on the right side in the figure via a tray 30. The inverter 20 includes an electrical component (a high-voltage component) to which a high voltage of more than 100 V is applied, and a high collision safety is required for the inverter 20, so that the high-voltage component provided therein is not exposed at the time of a collision. Since the inverter 20 is an important component (a basic component), the inverter 20 is firmly fixed to the side member 3. As will be described later in detail, the tray 30 includes a removal mechanism configured to remove the inverter 20 so as to move freely at the time when a vehicle has a collision and an impact force of a predetermined magnitude is applied to the inverter 20 from its front side. The removal mechanism is provided so as to cause the inverter 20 to move freely at the time of a collision so that an impact applied to the inverter 20 is relaxed and the high-voltage component provided therein is prevented from being exposed.

As well illustrated in FIG. 1, a right side of the motor unit 40 and the inverter 20 are fixed to the side member 3 on the right side in the figure, and the engine mount bolt 6 is placed just behind the inverter 20. As had described earlier, at the time of a collision, the inverter 20 is removed from the tray 30 so as to move freely. However, the engine mount bolt 6, which is rigid and large, is placed just behind the inverter 20, and when the inverter 20 collides with the engine mount bolt 6, the case of the inverter 20 might be damaged. Particularly, the case of the inverter 20 is made of aluminum, and upon receipt of large damage, the case might be broken and the high-voltage component provided therein might be exposed. The electrically-driven vehicle 10 has a structure to avoid such damage. Next will be described the structure.

Figure 2:
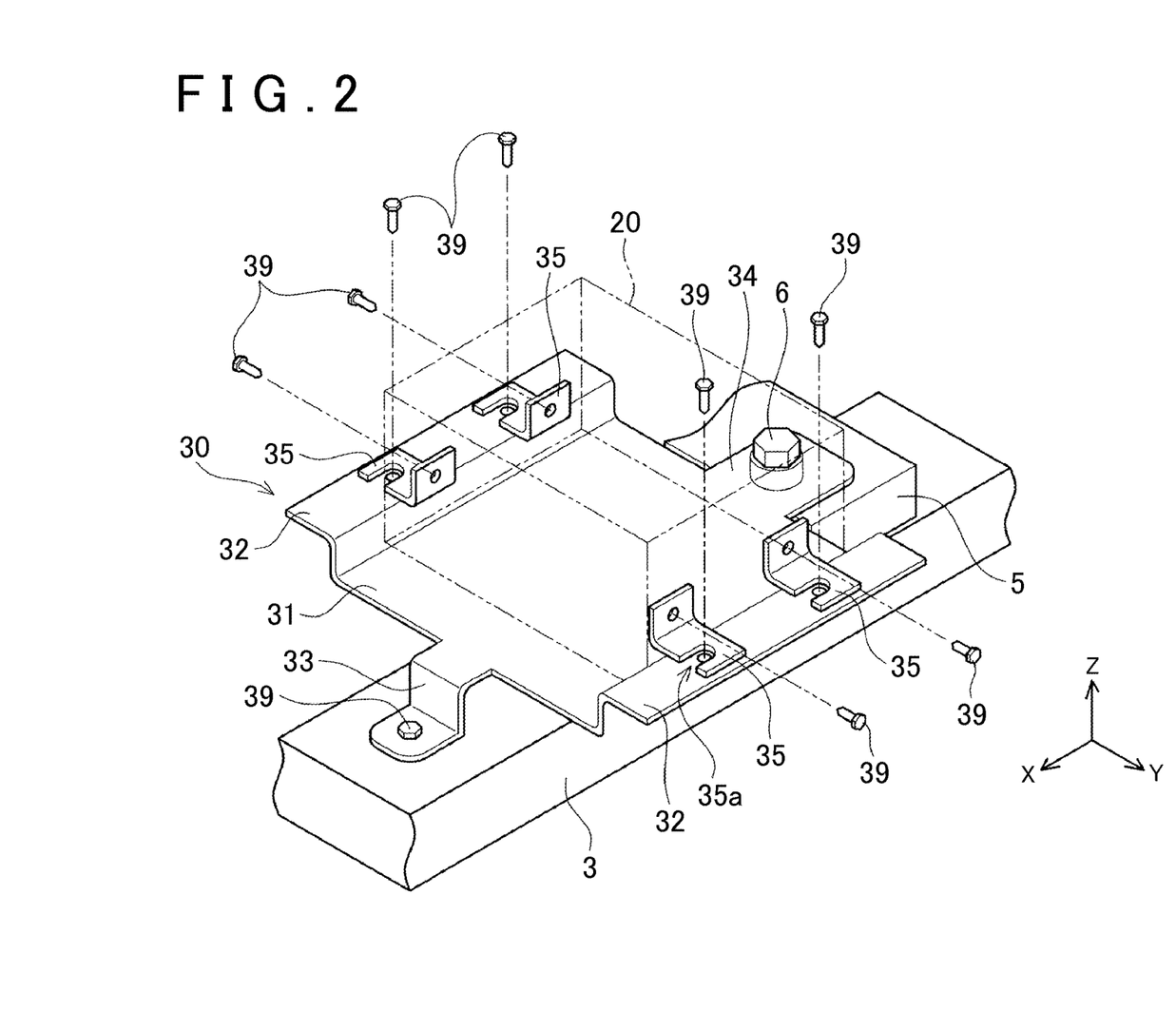
FIG. 2 is a perspective view illustrating a positional relationship between an inverter and an engine mount bolt illustrated in FIG. 1.

FIG. 2 illustrates a positional relationship between the inverter 20 and the engine mount bolt 6. Further, FIG. 2 illustrates a structure of the tray 30. Note that, in FIG. 2, for easy understanding of the structure of the tray 30, the inverter 20 is indicated as a simple rectangular solid of a virtual line.

First described is the structure of the tray 30. The tray 30 includes a flat bottom plate 31, and side flanges 32 on right and left sides of the flat bottom plate 31. The side flanges 32 extend in the front-rear direction, and are slightly higher than the bottom plate 31 due to a step. The tray 30 itself is fixed to the side member 3 by a bolt 39 via an L-shaped front flange 33 extending in front of the bottom plate 31. Further, the tray 30 is fixed to the engine mount 5 by the engine mount bolt 6 via a rear flange 34 extending behind the bottom plate 31. Thus, the tray 30 itself is placed just before the engine mount 5, and hereby, the engine mount bolt 6 is placed just behind the inverter 20. Note that the engine mount is a vibration isolation bracket and has a complicated shape. However, the engine mount is simplified in the figure. Further, in the figures subsequent to FIG. 2, the motor unit 40 fixed via the engine mount 5 is not illustrated.

The following describes an attachment structure of the inverter 20 to the tray 30. Right and left side surfaces of the inverter 20 are attached to the tray 30 (the side flange 32) via brackets 35. The bracket 35 has an L-shape. One surface of the L-shape (a surface thereof extending in a vertical direction) is opposed to a side surface of the inverter 20, and the surface is fixed to the inverter 20 by a bolt 39. The other surface of the L-shape (a surface thereof extending in a horizontal direction) is opposed to the side flange 32. A slit 35a that is opened forward (toward the front side of the vehicle) is provided on the other surface. The bracket 35 is fixed to the side flange 32 by the bolt 39 via the slit 35a. Four parts of the inverter 20 to be fixed are all fixed by brackets 35 similar to the above. When a vehicle has a collision and the inverter 20 receives an impact force of a predetermined magnitude from its front side, the bolt 39 and the bracket 35 move relative to each other along the slit 35a. The bracket 35 and the inverter 20 move rearward, so that the bolt 39 is removed from the slit 35a, and the bracket 35 (that is, the inverter 20) is removed from the tray 30. A combination of the bolt 39 and that slit 35a of the bracket 35 which is opened forward correspond to the removal mechanism. A minimum value of the impact force that operates the removal mechanism is determined in advance by simulation or experiment.

Figure 3:
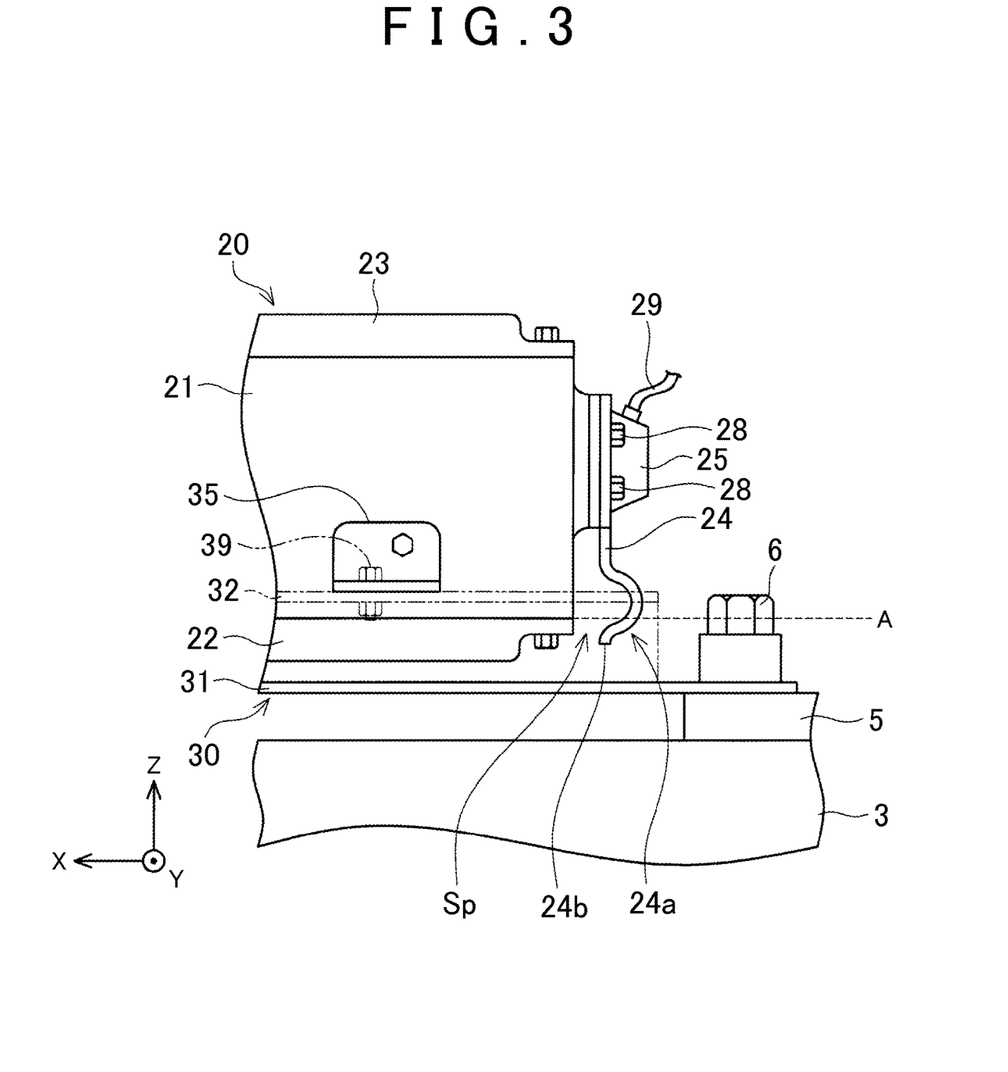
FIG. 3 is a perspective view illustrating the positional relationship between the inverter and the engine mount bolt illustrated in FIG. 1.
Figure 4:
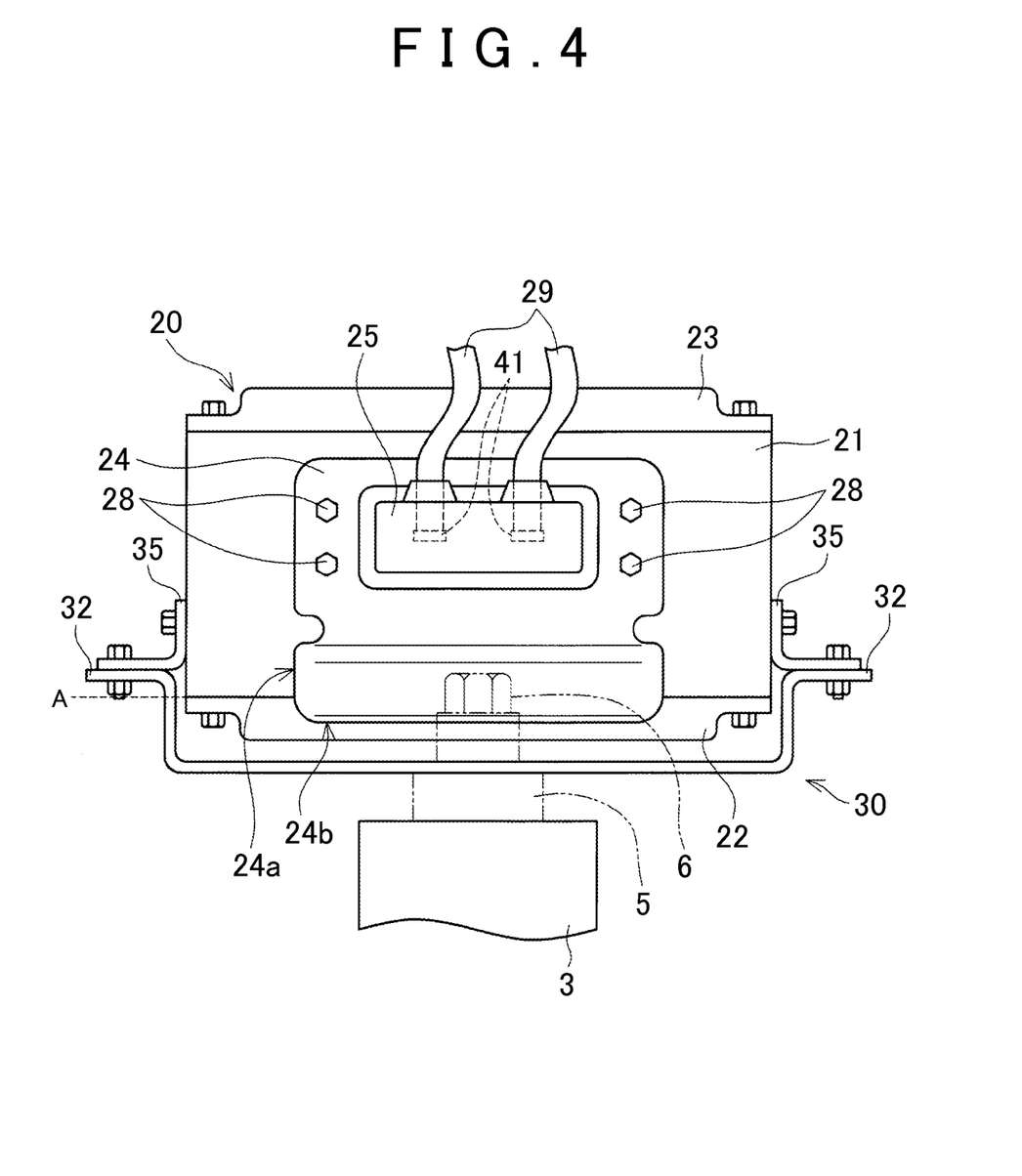
FIG. 4 is a rear view illustrating the positional relationship between the inverter and the engine mount bolt illustrated in FIG. 1.

FIG. 3 is a side view illustrating a positional relationship between a rear part of the inverter 20 and the engine mount bolt 6, and FIG. 4 is a rear view of the inverter 20. For easy understanding of the figures, the side flange 32 of the tray 30 and the bolt 39 for fixing the bracket 35 to the side flange 32 are indicated by virtual lines in FIG. 3. Further, the engine mount 5 and the engine mount bolt 6 are illustrated by virtual lines in FIG. 4.

The case 21 of the inverter 20 is made of aluminum. Top and bottom sides of the case 21 are opened. An upper opening of the case 21 is closed by an iron upper cover 23, and a lower opening thereof is closed by an iron lower cover 22. A power cable 29 for supplying electric power to the motor extends from a rear face of the case 21. A connector 41 of the power cable 29 is connected to a receiving-side connector provided in a substrate inside the case 21 through an opening (not shown) provided on the rear face of the case 21. The opening on the rear face of the case is covered with an iron connector cover 25. The connector cover 25 is fixed together with a protecting plate 24 (described later) by a bolt 28. The connector cover 25 protects the connector 41, particularly protects the connector 41 from water such as rain. Note that the electrically-driven vehicle 10 includes two drive motors, and the inverter 20 supplies electric power to each of the motors. Accordingly, two power cables 29 extend from the rear face of the inverter 20, and two connectors 41 are provided inside the case 21. Note that the connectors 41 are illustrated only in FIG. 4, and are not illustrated in the other figures.

The following describes the protecting plate 24. The protecting plate 24 is attached to the rear face of the case 21, so as to cover a range opposed to the engine mount bolt 6. An upper part of the protecting plate 24 is fixed together with the connector cover 25 as described above. The protecting plate 24 extends downward from its fixation part along the rear face of the case. A bottom end 24b of the protecting plate 24 extends to a position slightly lower than the case 21. A broken line A illustrated in FIGS. 3 and 4 indicates a height of a bottom end of the case 21. The bottom end 24b of the protecting plate 24 is placed below the broken line A. Note that, as has been described earlier, the iron lower cover 22 is attached to the bottom face of the case 21, and the protecting plate 24 extends to a middle of the lower cover 22 in the vertical direction. A space Sp is provided between the bottom end 24b of the protecting plate 24 and the case 21.

When viewed from the width direction of the vehicle (the Y-axis direction in the figure), a lower side part of the protecting plate 24 is curved in a U-shape so as to project toward a bolt head of the engine mount bolt 6. In other words, the lower side part of the protecting plate 24 is curved in a U-shape so as to project toward the bolt head placed at a rear side of the vehicle relative to the inverter 20. Hereinafter, the part curved in a U-shape is referred to as a U-shaped curved portion. A reference sign 24a in FIGS. 3 and 4 indicates the U-shaped curved portion. When the inverter 20 moves rearward at the time of a collision, the U-shaped curved portion 24a of the protecting plate 24 prevents the case 21 from strongly colliding with the engine mount bolt 6. The following describes its mechanism.

Figure 5:
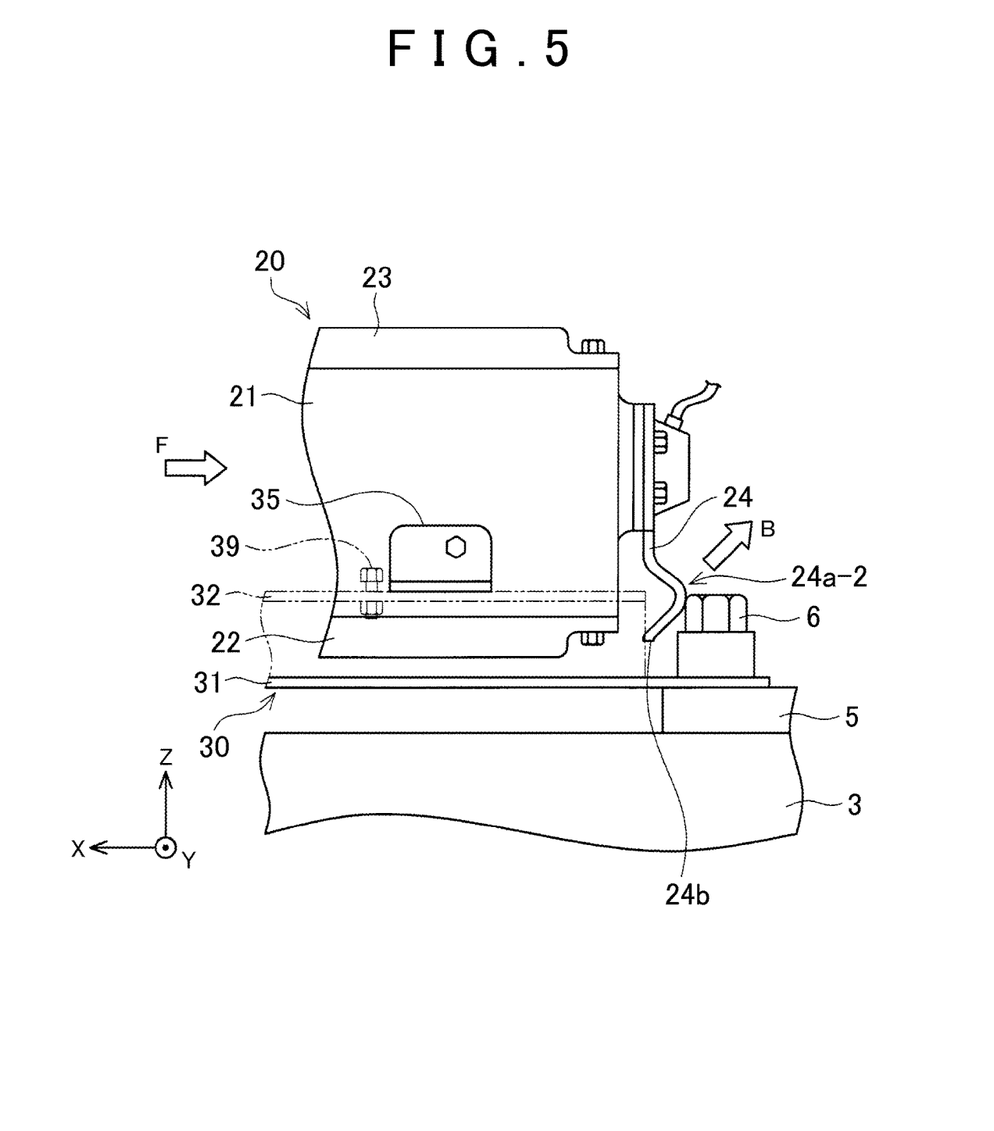
FIG. 5 is a view to describe movement of the inverter at the time when the electrically-driven vehicle has a collision, and a state just before deformation of a protecting plate for protecting the inverter.
Figure 6:
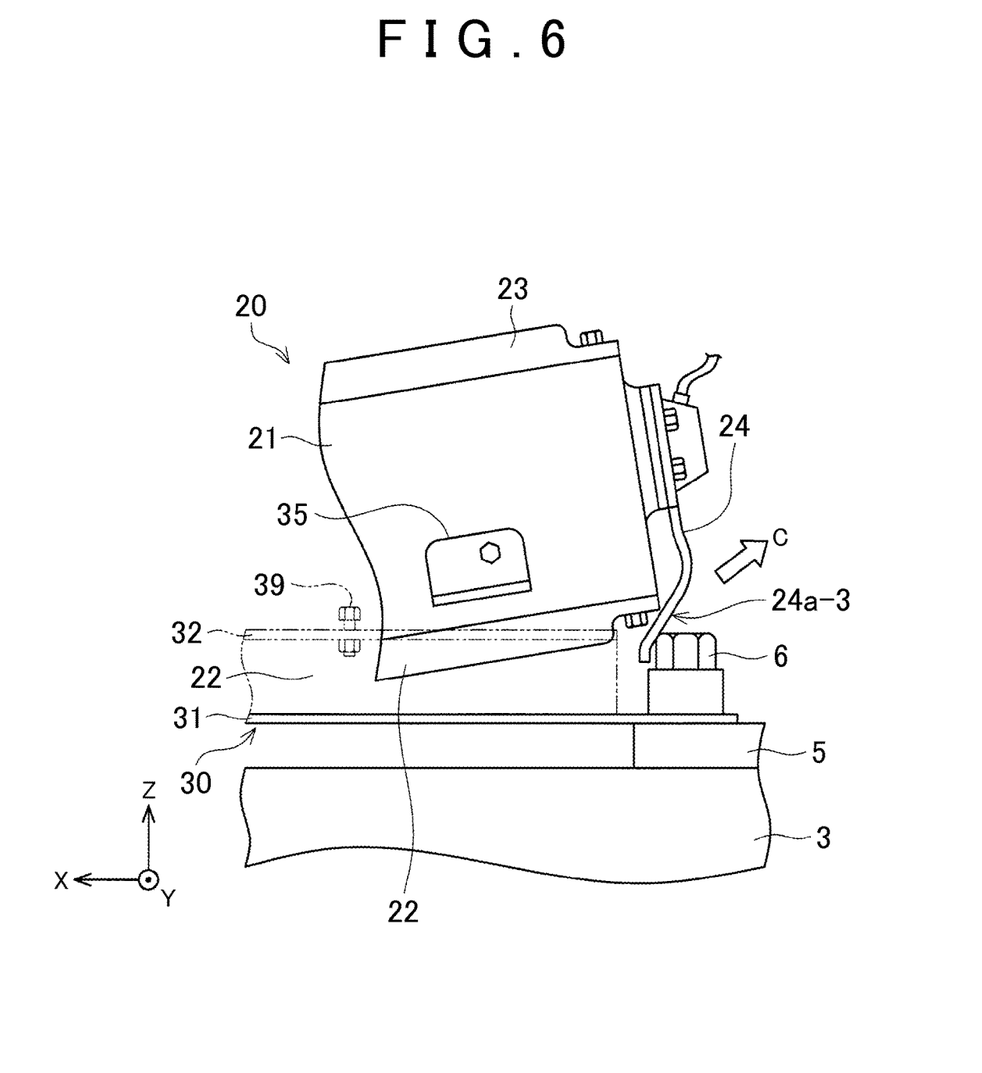
FIG. 6 is a view to describe the movement of the inverter at the time when the electrically-driven vehicle has a collision and a state just after the deformation of the protecting plate.

FIGS. 5 and 6 illustrate movement of the inverter 20 at the time when an impact is applied to the inverter 20 from its front side. FIG. 5 illustrates a state where the inverter 20 slightly moves rearward, and FIG. 6 illustrates a state where the inverter 20 moves further rearward. Similarly to FIG. 4, the side flange 32 of the tray 30 and the bolt 39 are illustrated by virtual lines in FIGS. 5 and 6, for easy understanding of the figures.

As has been described earlier, the bracket 35 for fixing the inverter 20 is fixed to the side flange 32 by the bolt 39 via the slit 35a that is opened forward (see FIG. 2). When a strong impact force F is applied to the inverter 20 from its front side, the bolt 39 and the bracket 35 move relative to each other along the slit 35a, so that the bracket 35 and the inverter 20 move rearward. When the bolt 39 is removed from the slit 35a (FIG. 5), the inverter 20 can move freely.

The engine mount bolt 6, which is rigid and large and is firmly fixed to the side member 3, is placed just behind the inverter 20. When the inverter 20 moves rearward, the U-shaped curved portion 24a of the protecting plate 24 first makes contact with the engine mount bolt 6. An upper part of the protecting plate 24 is fixed to the case 21, and the bottom end 24b thereof is a free end. Accordingly, the U-shaped curved portion 24a is deformed so that the bottom end 24b slips under a lower side of the case. A reference sign 24a-2 of FIG. 5 indicates a U-shaped curved portion in the middle of the deformation. Due to a reaction to the deformation of the U-shaped curved portion 24a, the case 21 (the inverter 20) is guided to a rear upper direction as indicated by an arrow B.

When the inverter 20 moves further rearward, the U-shaped curved portion 24a-2 is further deformed, so that a U-shaped curved portion 24a-3 (see FIG. 6) slips over the bolt head of the engine mount bolt 6. In reaction to that, an orientation of movement of a rear end of the inverter 20 is changed further toward a rear upper side. The inverter 20 moves rearward so that the protecting plate 24 thus deformed slips over the engine mount bolt 6. As a result, it is possible to prevent the rear face of the inverter 20 from colliding head-on with the engine mount bolt 6.

As described above, the protecting plate 24 not only relaxes an impact of the collision between the inverter 20 and the engine mount bolt 6, but also changes a moving direction of the inverter 20 into an upper side relative to the engine mount bolt 6. Due to such an operation, it is possible to prevent the inverter 20 from severely colliding with the engine mount bolt. The reason why such an operation can be obtained is because a structural object (the engine mount bolt 6) behind the inverter 20 has such a positional relationship that its height is the same as a height of the U-shaped curved portion 24a of the protecting plate 24 provided in the inverter 20.

Below are notes regarding the technique explained in the embodiment. If a bottom end of the protecting plate 24 extends at least to a bottom end of the case, the above effect can be obtained. The space Sp is secured between the bottom end 24b of the protecting plate 24 and the case 21, and the protecting plate 24 does not disturb attachment and detachment of the lower cover 22. Note that the U-shaped curved portion of the protecting plate may have a C-shape, and it is not necessary that the curved portion have an exactly "U" shape.

In the present embodiment, the engine mount bolt 6 is opposed to the rear face of the inverter 20, and the protecting plate 24 protects the case of the inverter 20 from a collision with the engine mount bolt 6. The technique described in the present specification can be preferably applied to an electric apparatus except the inverter 20, e.g., a battery. Further, a fixing structural object with which the inverter 20 may collide is not limited to the engine mount bolt 6. For example, in a case where the engine mount 5 itself is placed just behind the rear face of the inverter 20, the protecting plate may protect the case of the inverter 20 from a collision with the engine mount. The engine mount bolt 6 is one example of the fixing structural object with which the inverter 20 may collide.

The specific example of the invention has been explained in detail. However, the example is for illustration only, and does not limit the scope of the claims. The technique described in the scope of the claims includes the foregoing example with various modifications and changes. Each of and various combinations of the technical elements explained in this specification and the drawings achieve technical utility, and the technical elements are not limited to the combination stated in the claims at the time of filing. The technology explained in this specification and the drawings as an example is able to achieve the plurality of objectives simultaneously, and has technical utility by achieving one of the objectives.

What is claimed is:

1. A fixing structure of an electric apparatus, the electric apparatus being mounted in an engine compartment provided in a front portion of a vehicle, the fixing structure comprising:
   a tray fixed in the engine compartment, the tray placing the electric apparatus;

a removal mechanism configured to remove the electric apparatus from the tray when the electric apparatus receives a predetermined impact force or more from a front side of the vehicle; and a protecting plate attached to the electric apparatus, the protecting plate being configured to abut with a structural object placed at a rear side of the vehicle relative to the electric apparatus when the electric apparatus is removed from the tray due to the impact force so as to move rearward, wherein the protecting plate is attached to the electric apparatus at a position opposed to the structural object in a front-rear direction of the vehicle, the protecting plate is fixed to a rear face of the electric apparatus and extends downward, the protecting plate is curved in a U-shape so as to project toward the structural object when viewed from a crosswise direction of the vehicle, and a bottom end of the protecting plate is placed at the same height as a bottom end of the electric apparatus or placed at a position lower than the bottom end of the electric apparatus.

2. The fixing structure according to claim 1, wherein:

the removal mechanism includes a bracket and a bolt;

the bracket has a slit and is attached to the electric apparatus; and the bolt is configured to fix the bracket to the tray.

3. The fixing structure according to claim 1, wherein the electric apparatus includes an inverter, the inverter is configured to convert a direct-current power of a battery into an alternating-current power and the inverter is configured to supply the alternating-current power to a drive motor.

* * * * *